United States Patent
Daoud

(12)
(10) Patent No.: US 6,373,259 B1
(45) Date of Patent: *Apr. 16, 2002

(54) CONNECTOR TESTING SYSTEM HAVING A TEST PRONG INCLUDING A PROJECTION

(75) Inventor: Bassel Hage Daoud, Parsippany, NJ (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/264,793

(22) Filed: Mar. 9, 1999

(51) Int. Cl.⁷ ............................................... A01H 31/04
(52) U.S. Cl. ........................................ 324/538; 439/426
(58) Field of Search ................................. 439/395, 392, 439/403, 557, 712, 942, 404, 426, 912, 259, 482, 263; 324/761, 755, 537, 754, 756, 757, 758, 538

(56) References Cited

U.S. PATENT DOCUMENTS

| | | |
|---|---|---|
| 1,917,683 A | 7/1933 | Anderson |
| 1,926,936 A | 9/1933 | Casingena et al. |
| 2,732,446 A | 1/1956 | Gilmore |
| 2,895,119 A | 7/1959 | Montgomery, Jr. |
| 2,920,303 A | 1/1960 | Johnson |
| 3,038,141 A | 6/1962 | Chiuchiolo |
| 3,134,632 A | 5/1964 | Kimball et al. |
| 3,546,664 A | 12/1970 | De Bolt et al. |
| 3,571,779 A | 3/1971 | Collier |
| 3,609,647 A | 9/1971 | Castellano |
| 3,885,850 A | 5/1975 | Witte et al. |
| 3,918,784 A | 11/1975 | Lemke et al. |
| 3,973,995 A | 8/1976 | DeVito |
| 4,232,924 A | 11/1980 | Kline et al. |
| 4,342,495 A | 8/1982 | Bennett |
| 4,394,620 A | 7/1983 | Montalto et al. |
| 4,398,073 A | 8/1983 | Botz et al. |
| 4,491,381 A | 1/1985 | Hamsher et al. |
| 4,822,290 A | 4/1989 | Cauley et al. |
| 4,947,115 A | 8/1990 | Siemon et al. |
| 5,431,578 A | 7/1995 | Wayne |
| 5,454,729 A | 10/1995 | Wen-Te |
| 5,477,161 A | * 12/1995 | Kardos et al. ............... 324/755 |
| 5,614,820 A | 3/1997 | Aoyama et al. |
| 5,807,126 A | * 9/1998 | Bethurum .................... 439/259 |
| 6,129,575 A | 10/2000 | Daoud |
| 6,129,577 A | * 10/2000 | Daoud ......................... 439/482 |

OTHER PUBLICATIONS

Technical Data Sheet of A.C. Egerton Limited, related to Mini Rocker Cross Connection Cabinets.

* cited by examiner

Primary Examiner—Safet Metjahic
Assistant Examiner—Etienne LeRoux
(74) Attorney, Agent, or Firm—Stroock & Stroock & Lavan LLP

(57) ABSTRACT

A connector testing system includes a connector having a top section and a housing having a test channel formed therein, an electrically conductive terminal strip disposed within the connector, a portion of the terminal strip disposed within the test channel, and a bridge clip having a body and a test probe connected thereto. The test probe can include an outer surface having a projection and a probe section that is guided by the test channel to the terminal strip when the test probe is inserted into the test channel. The top section of the connector has a shoulder sized and shaped to accept the projection and the connector including a side wall having a guiding portion sized and shaped to contact the probe section when the test probe is inserted into the test channel.

27 Claims, 4 Drawing Sheets

CONNECTOR TESTING SYSTEM HAVING A TEST PRONG INCLUDING A PROJECTION

FIELD OF THE INVENTION

This invention relates to the field of telephone wire connector blocks and distribution systems, and specifically to a connector and a test device for testing wiring connected to the connector.

BACKGROUND OF INVENTION

In a telephone network, a network cable from the central office is generally connected to a junction box, such as, for example, a building entrance protector (BEP) or network interface unit (NIU) located at the customer site, where the individual telephone lines are broken out line-by-line. The network cable, which consists of a plurality of tip-ring wire pairs that each represent a telephone line, is typically connected to a connector block containing an array of individual connectors that forms a part of the BEP. Such connectors may be, for example, mini-rocker toolless insulation displacement (IDC)-type connectors, such as, for example, those sold by A.C. Egerton, Ltd. Other connectors used for telephony wiring applications are described in U.S. Pat. No. 4,662,699 to Vachhani et al., dated May 5, 1987, and in U.S. Pat. No. 3,611,264 to Ellis, dated Oct. 5, 1971.

The customer telephone equipment is coupled through such an IDC connector to, for example, a central office telephone line. The connector generally has a top section that includes two wire insertion holes and a housing within which a pair of spaced-apart terminal strips are disposed. The wire insertion holes each accommodate one wire of a tip-ring wire pair. The top section pivots about a generally hinged fixed axis located on the side opposite the wire insertion holes and has a movable clasp for maintaining the top section in its closed position.

To open the top section, a user releases the clasp member and pivots the top section to its open position. When the top section is in its open position, the terminal strips do not intersect the wire insertion holes, but when the top section is in its closed position, the terminal strips intersect the wire insertion holes. Therefore, to establish an electrical and mechanical connection between the wires and the terminal strips, a user first opens the top section (i.e., pivots the top section to its open position), inserts the pair of wires, and then closes the top section. Upon closing the top section of the connector, the wires are brought into electrical and mechanical contact with the terminal strips. To remove the wires and/or break the electrical connection, the process is reversed.

To verify the integrity of a telephone line, the telephone line may be tested at the connector using a bridge clip, a test probe or other common test gear. The bridge clip includes a body, at least a first test prong and a second test prong connected to the body, and lead wires for connecting the first and second test prongs to a testing device, such as a voltmeter or telephone test set. Two test channels sized to accommodate a test prong of the bridge clip are formed in the housing of the connector and a portion of a respective one of the pair of terminal strips is disposed in each of the test channels. The test channels of prior art connectors generally have uniform dimensions. That is, the width and depth of the channel remain constant along the entire length of the channel. The test prongs or test leads of the bridge clip are spaced apart and constructed to be received within the channels.

Testing is typically performed by inserting the test prongs of a bridge clip into the test channels of the connector until each of the test prongs contacts an outside edge of a respective one of the pair of terminal strips housed within the housing to make an electrical connection. If a current flow is detected, or a dial tone is heard, depending on the test methodology, then a loop condition exists for that particular tip-ring wire pair, and the integrity of the line is verified. If no loop condition is found, either an electrical open or short exists in telephone line or a connection to or in the terminal block is defective.

Prior art test prongs typically consist of flexible metallic strips or test probes that are bent inwardly at one location so as to bias the free end of the test prong toward the terminal strip when the test probes are inserted into the test channels of the connector. One example of such a bridge clip is A. C. Egerton part no. RBC2210. After repeated use, however, one or both of the test prongs tend to lose its original shape through the repetitive flexing of the prongs during testing. As such, the electrical contact made between the test prongs and the terminal strip made when the test prong is inserted into the test channel becomes unreliable, in part, because the test prongs are permitted to move within the test channel.

Further, the prior art connector testing systems do not prevent the user from inadvertently overinserting the test prongs to a position where the prongs cause damage to the connector. When correctly inserted into the test channels of the prior art connector, the prior art bridge clip body is spaced apart from the top section of the connector. Therefore, the prior art mini-rocker connector testing systems provide no indicator or signal to the craftsperson when the test prongs of the bridge clip are properly positioned within test channels of the connector.

SUMMARY OF THE INVENTION

The present invention is directed at overcoming shortcomings in the prior art. A connector testing system in accordance with the present invention preferably includes a bridge clip having a body and a test probe or test lead connected to the body at a proximal end of the test lead, a connector having a top section and a housing, and an electrically conductive terminal strip disposed within the connector. The housing has a test channel that is sized and shaped to accept the test probe, and within which a portion of the terminal strip is disposed.

The top section of the connector includes a sloping region and a shoulder formed at the lower edge of the sloping region. The shoulder is sized and shaped to accept the second bend of the test probe when the test probe is inserted into the test channel. The housing includes a side wall, having an upper portion and a lower portion, that defines one side of the test channel. The side wall includes a guiding portion positioned below the shoulder for both guiding the test probe tip into contact with the terminal strip portion and preventing the test probe from being further inserted into the test channel at a location where the tip contacts the terminal strip.

In a preferred embodiment, the test probe is bent in three locations to form three bends. When the test probe is positioned to be inserted within the connector for testing, a first section of the test probe is connected at a proximal end of the test probe to the body of the bridge clip and is bent at a first bend to form a second section. The second section extends distally from the first bend toward the top section of the connector. The second section is bent at a second bend to create a third section, which is angled away from the top section of the connector, and extends distally from the second bend. The third section is bent at a third bend to create a fourth section, which is angled toward the top section of the connector, and extends distally from the third bend. The test probe tip forms part of the fourth section and therefore is angled toward the top section of the connector. In this case, the guiding portion of the side wall has a slope that is substantially parallel to the slope of the fourth section of the test probe.

To test an electrical connection of the connector, the craftsperson inserts the test probe into the test channel until the tip contacts the sloping region of the top section. The sloping portion guides the tip into the test channel of the connector until the outside surface of the fourth section or the third bend of the test probe contacts the side wall of the connector. At this point, the craftsperson continues to insert the bridge clip into the test channel which causes the test probe to slide down the inner surface of the side wall until the outside surface of the fourth section of the test probe contacts the guiding portion of the side wall. At this position, the second bend of the test probe contacts the sloping region of the top section and is positioned at the lower edge of the sloping region, just above the shoulder. Further pressure by the craftsperson causes the first section of the probe to flex to permit the second bend to slide by the lower edge of the sloping region until the second bend contacts or seats against the shoulder. At this position, the test probe is firmly seated within the test channel between the inner surface of the side wall and the shoulder of the top section, and the tip of the test probe contacts the outer edge of the terminal strip.

Preferably, the length of the test probe portion between the second and third bends is approximately equal to the distance from the stop surface of the side wall to the shoulder of the top section such that, when the test probe is in the fully inserted position, the test probe is securely seated within the test channel between the stop and the shoulder. In this way, the stop together with the shoulder of the top section prevent the test probe from being overinserted into the test channel and provide surfaces that bias the test probe tip against the terminal strip. As such, the craftsperson is not required to hold the test probe to ensure proper contact with the terminal strip when testing the electrical connection. Further, when the test probe is in its fully seated within the connector, the craftsperson perceives an audible click or tactile vibration, or both, which act as a signal that indicates to the craftsperson to stop inserting the test probe into the test channel, thereby protecting the interior connector components from damage due to overinsertion.

In a second embodiment, the test probe includes a tip and is bent in at least at two locations to form two bends. Accordingly, the test probe is divided into at least three separate sections: a first section, which is attached to the bridge clip at the body at a proximal end and bent at a first bend to form a second section extending from the first bend in a direction away from the top section of the connector. The second section is bent at a second bend to form a third section that includes a tip formed at the third section distal section and extends from the second bend in a direction toward the top section of the connector. The test probe includes an outer surface having a projection located proximate to the first bend. As is described below, when the test probe is in its fully inserted position within the test channel, the second section of the test probe is compressed within the test channel and the test probe is secured within the test channel by the abutment of the projection against the top portion and the second section against the inner surface of the side wall.

To use the second embodiment to test an electrical connection of the connector, the craftsperson inserts the test probe into the test channel until the tip contacts the sloping region of the top section. The sloping portion guides the tip into the test channel of the connector until the outside surface of the third section or the second bend of the test probe contacts the side wall of the connector. At this point, the craftsperson continues to insert the bridge clip into the test channel which causes the second bend of the test probe to slide down the inner surface of the side wall until the outside surface of the third section of the test probe contacts the guiding portion of the side wall. At this position, the projection of the test probe contacts the sloping region of the top section and is positioned at the lower edge of the sloping region, just above the shoulder. Further pressure by the craftsperson causes the first section of the probe to flex to permit the projection to slide by the lower edge of the sloping region until the projection contacts or seats within the shoulder. At this position, the test probe is firmly seated within the test channel between the inner surface of the side wall and the shoulder of the top section, and the tip of the test probe contacts the outer edge of the terminal strip.

In this way, the testing system provides a reliable way of preventing overinsertion of the test probe and provides structure that holds the test probe in contact with the terminal strip while providing a positive strain relief to maintain the test probe at that position to ensure continuous electrical contact with the terminal strip during testing procedures.

Other objects and features of the present invention will become apparent from the following detailed description, considered in conjunction with the accompanying drawing figures. It is to be understood, however, that the drawings, which are not to scale, are designed solely for the purpose of illustration and not as a definition of the limits of the invention, for which reference should be made to the appended claims.

BRIEF DESCRIPTION OF THE DRAWINGS

In the drawing figures, which are not to scale, and which are merely illustrative, and wherein like reference numerals depict like elements throughout the several views.

DETAILED DESCRIPTION OF THE PREFERRED EMBODIMENTS

Generally speaking, in accordance the present invention, a connector testing system is provided that provides a more reliable testing configuration.

Figure 1:
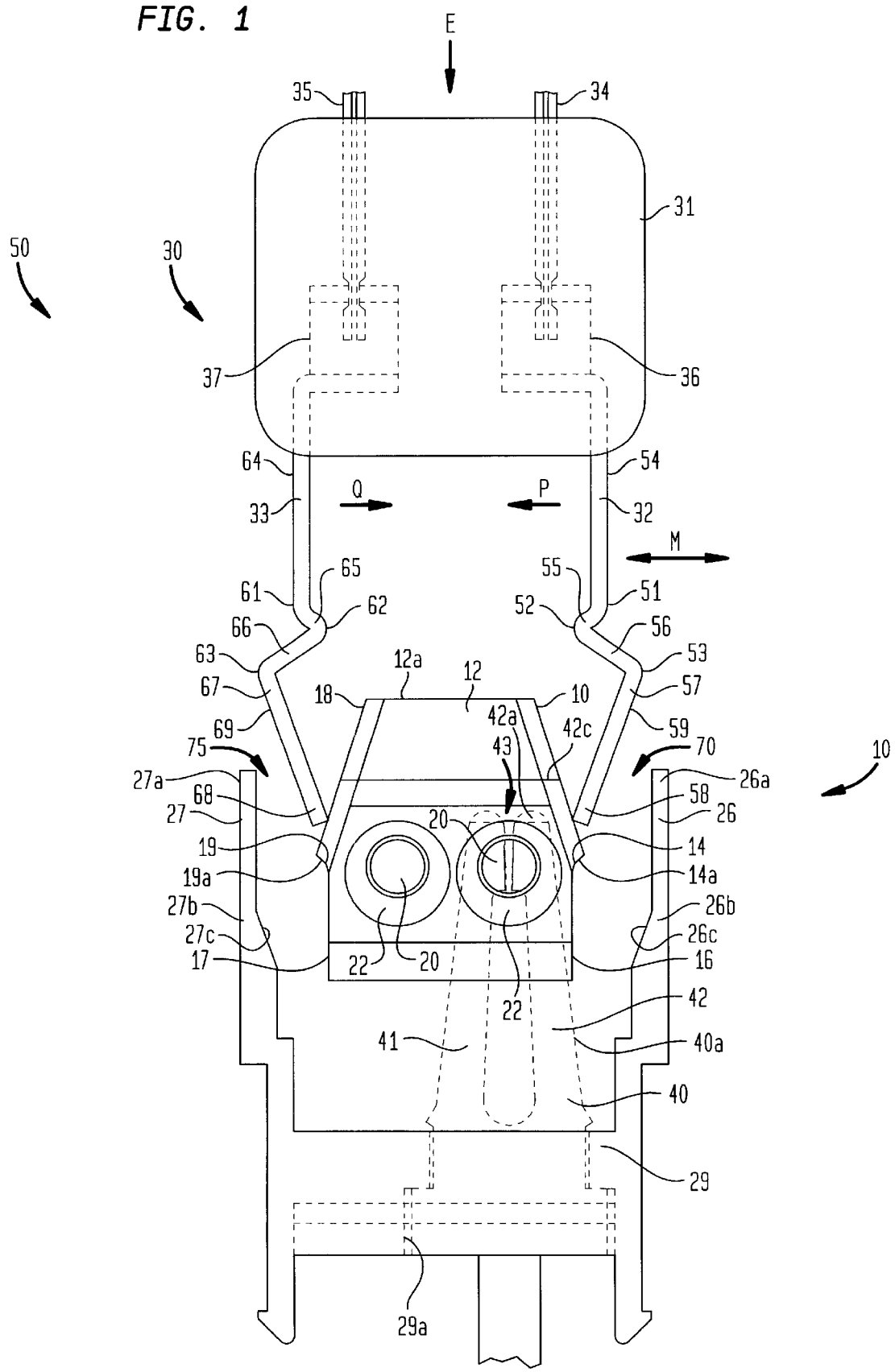
FIG. 1 is a front sectional view of a connector testing system constructed in accordance with the present invention in a first position.
Figure 3:
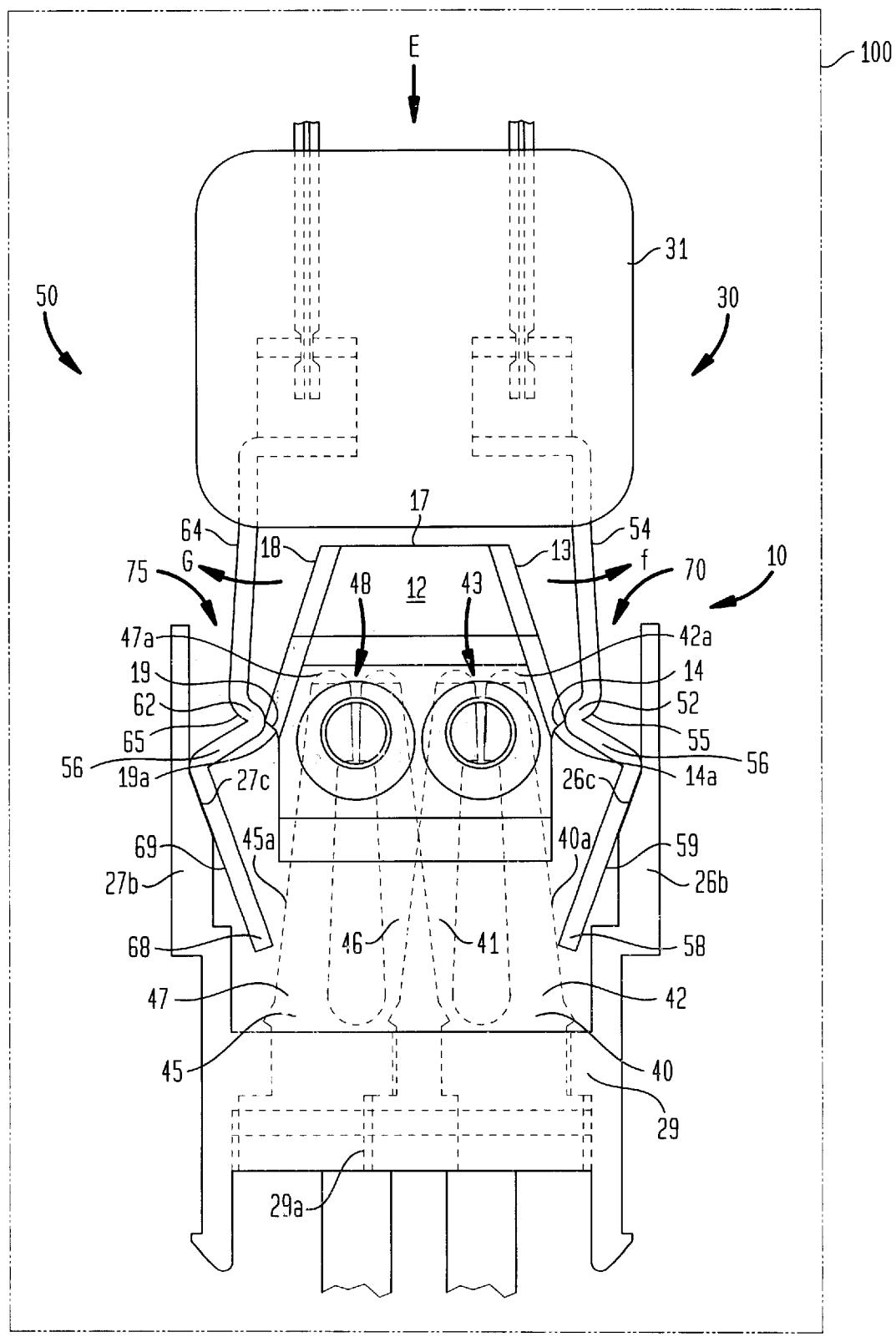
FIG. 3 is a front sectional view of the connector testing system of FIG. 1 in a third position.
Figure 4:
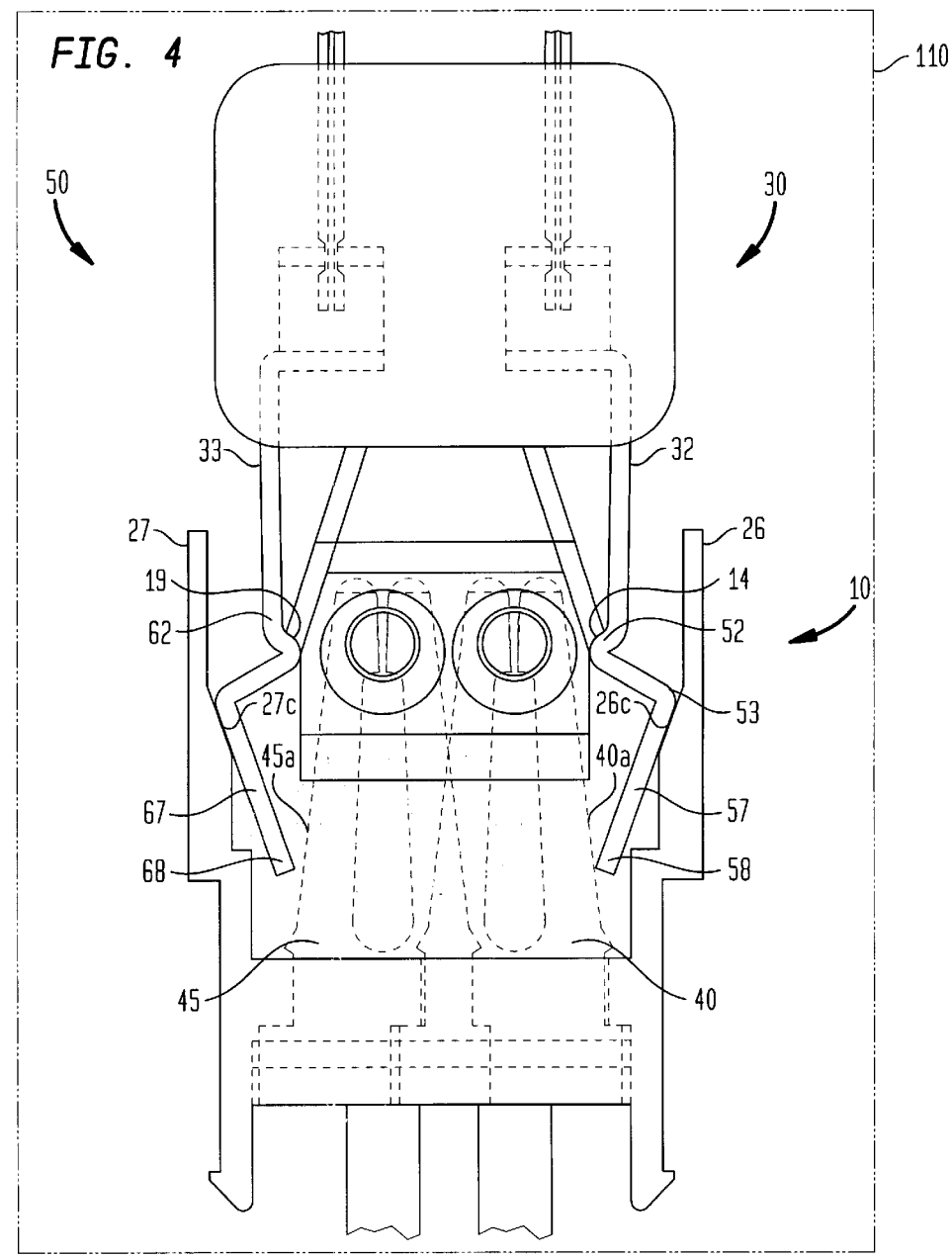
FIG. 4 is a front sectional view of the connector testing system of FIG. 1 in a fourth position.

Referring initially to FIG. 1, a connector testing system 50 includes a bridge clip 30, a connector 10 having a housing 25 and a top section 12, and a first terminal strip 40 disposed within housing 25 and top section 12 when top section 12 is in the closed position as is shown in each of the figures. Referring to FIG. 3, in a preferred embodiment, the connector includes a second terminal strip 45 disposed within housing 25. As is shown in FIGS. 1 and 4, to facilitate testing of connections made through connector 10, a first test channel 70 and a second test channel 75 are defined by housing 25 and top section 12 to permit bridge clip test probes to be inserted so as to contact terminal strips 40, 45. Bottom wall 29 has throughholes, one of which is labeled 29a, sized to accept terminal strips 40, 45. Terminal strips 40, 45 may be affixed to connector housing 25 by snap-fitting, or by any one of the numerous methods of affixation known in the art, such as by way of non-limiting example, adhesives, friction fitting, integral molding, screws, and the like, depending on whether ready removal and re-insertion of the terminal is required, as a matter of application-specific design choice.

Referring to FIGS. 1 and 3, terminal strip 40 includes an inner arm 41 and an outer arm 42 having a tip 42a, which together form an electrical conductor gripping region 43. Outer arm 42 includes a contact surface 40a that extends from tip 42a of outer arm 42 to the region of outer arm 42 adjacent bottom wall 29. Similarly, terminal strip 45 includes an inner arm 46 and an outer arm 47 having a tip 47a, which together form an electrical conductor gripping region 48. Outer arm 47 includes a contact surface 45a that extends from tip 47a of outer arm 47 to the region of outer arm 47 adjacent bottom wall 29.

Connector 10 has two entrance apertures 22 that lead to wire insertion holes 20. Wire insertion holes 20 are constructed to accept electrical conductors (not shown) in a manner known in the art. When top section 12 is in its closed position as shown in the figures, electrical conductors (not shown) are gripped within gripping regions 43, 48. Connector 10 is preferably formed of a molded synthetic resinous material with good insulating properties and mechanical strength. The specific materials utilized in constructing connector 10 are an application-specific matter of design choice within the knowledge of the person of skill familiar with wiring connectors and installing terminal blocks in telephony. In all embodiments, terminal strips 40, 45 and test probes 32, 33 may be formed of any commonly known electrically conductive metal or electrical conductor known in the art and suitable for use in such terminals or test probes, such as, for example, platinum-washed phosphor bronze, or beryllium-copper alloy or any other material, metal or alloy combining good electrical conductivity with sufficient mechanical strength and resilience.

Figure 2:
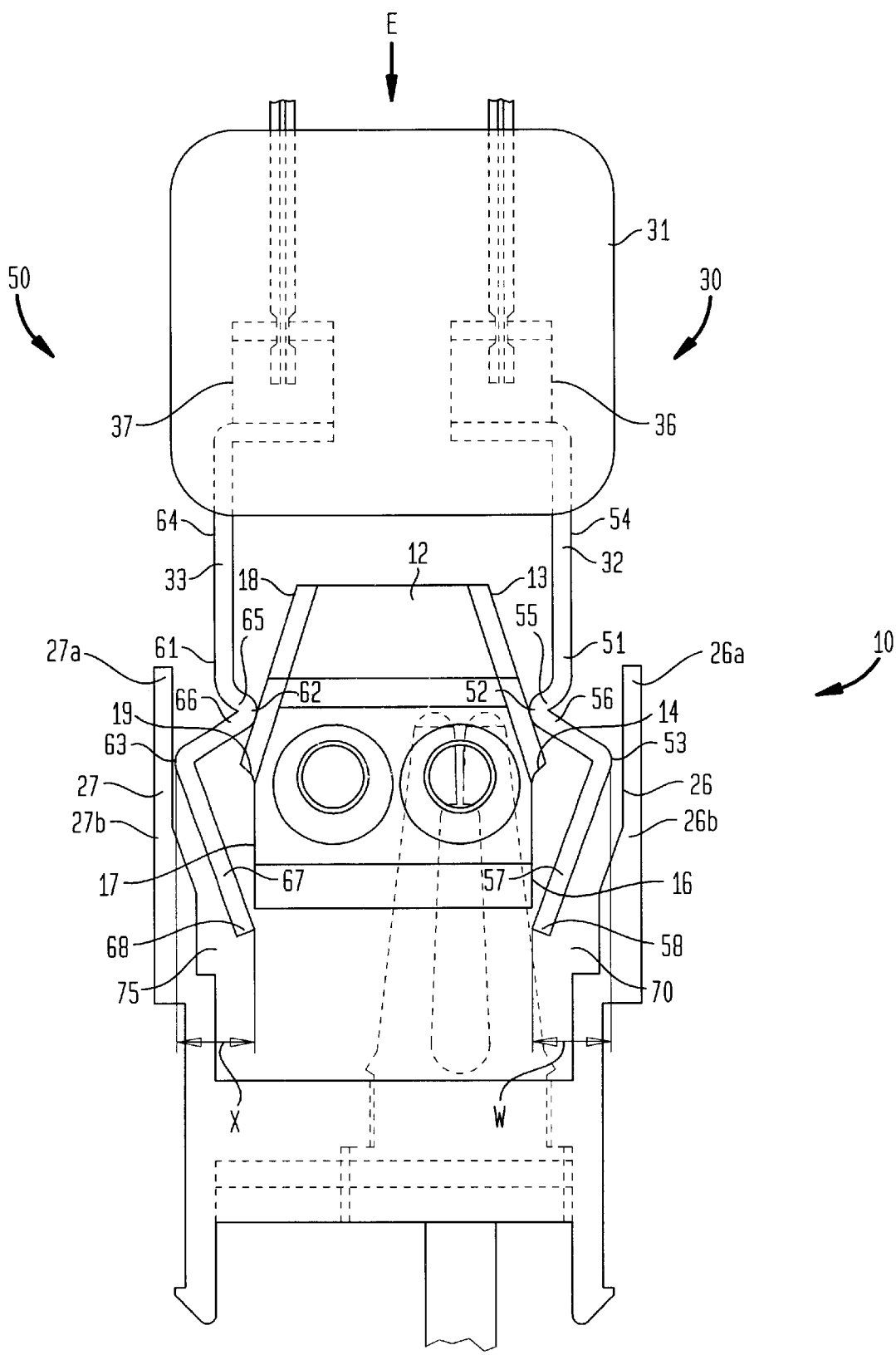
FIG. 2 is a front sectional view of the connector testing system of FIG. 1 in a second position

Referring to FIG. 1, top section 12 of connector 10 is preferably pivotably mounted to housing 25 about a hinge (not shown). Top section 12 includes an upper surface 12a and a first sloping region 13 extending downwardly from one side of upper surface 12a and a second sloping region 18 extending downwardly from the other side of upper surface 12a. Top section 12 also includes a first shoulder 14 having a surface 14a formed at the lower end of first sloping region 13 and a second shoulder 19 having a surface 19a formed at the lower end of second sloping region 18. Referring to FIGS. 2 and 3, a first lower surface 16 extends downwardly from first shoulder 14 and a second lower surface 17 extends downwardly from second shoulder 19.

Referring to FIG. 1, housing 25 includes a first side wall 26, a second side wall 27, a front wall and a rear wall (not shown) that extend between side walls 26, 27, and a bottom wall 29, positioned substantially perpendicular to side walls 26, 27 and front wall and rear wall and extending therebetween. Test channel 70 is defined by a portion of side wall 26, bottom wall 29, front wall and rear wall (not shown), and terminal strip 40. Test channel 75 is defined by a portion of side wall 27, bottom wall 29, front wall and rear wall (not shown), and terminal strip 45.

Side wall 26 includes an upper portion 26a, and a lower portion 26b having an inner surface 26c that slopes inwardly toward terminal strip 40. Inner surface 26c acts as a guide for guiding the test probe into contact with the terminal strip, while acting as a stop to prevent test probe 32 from being further inserted into test channel 70. Preferably, inner surface 26c is shaped such that, when test probe 32 is seated within test channel 70 as is described below, the test probe tip contacts terminal strip 40.

In a similar fashion, side wall 27 includes an upper portion 27a, and a lower portion 27b having an inner surface 27c that slopes inwardly toward terminal strip 45. Inner surface 27c acts as a guide for guiding the test probe into contact with the terminal strip, while acting as a stop to prevent test probe 33 from being further inserted into test channel 75. Preferably, inner surface 27c is shaped such that, when test probe 33 is seated within test channel 75 as is described below, the test probe tip contacts terminal strip 45.

Referring to FIG. 1, bridge clip 30 is depicted in greater detail. Bridge clip 30 includes a body 31 having connecting regions 36, 37, and test probes 32, 33 and electrical conductors 34, 35, which are attached to body 31 at connecting regions 36, 37. Preferably test probe 32 is spaced apart from test probe 33. Bridge clip 30 is preferably formed of two halves, one being the mirror image of the other. Test probes 32, 33 are preferably flat electrically conductive blades, but may be any shape, including, by way of non-limiting example, tapered cylinders, so long as the test probes are shaped to matingly engage with the testing channel of the connector.

Referring to FIGS. 1 and 2, in a preferred embodiment, test probe 32 is bent at three locations to form a first bend 51, a second bend 52 and a third bend 53. As such, test probe 32 includes a first section 54 connected at a distal end to body 31 at connection region 36, and which extends from body 31 to first bend 51, a second section 55 that extends from first bend 51 to second bend 52, a third section 56 that extends from second bend 52 to third bend 53, and a fourth section 57 that extends from third bend 53 and includes a tip 58 and an outer surface 59. First section 54 preferably includes a straight portion that is bent at first bend 51 in a direction toward top section 12 of connector 10. As is shown in the FIG. 1, first section 54 may also be bent at the location where test probe 32 is connected to body 31 at connection region 36 to ensure a secure connection to body 31. Second section 55 is bent at second bend 52 in a direction away from top section 12. Second bend 52 acts as a projection, which, as is described below, abuts a portion of the connector when test probe 32 is inserted into test channel 70. Third section 56 is bent at third bend 53 in a direction toward top section 12 to create fourth section 57. As such, test probe tip 58 is angled toward top section 12 of connector 10 in an inward direction indicated by arrow P.

Preferably, the slope of fourth section 57 is substantially equal to the slope of inner surface 26c. Further, shoulder 14 is preferably sized and shaped to accept the outer counter of second bend 52 of test probe 32 when test probe 32 is inserted into test channel 70. In this way, as is described below, when test probe 32 is fully inserted into test channel 70, fourth section 57 substantially mates with inner surface 26c of side wall 26 and second bend 52 abuts shoulder 14 to retain test probe 32 within test channel 70. Preferably, in this position, tip 58 makes electrical contact with terminal strip portion 40a.

Preferably, first bend 51 is positioned in a lateral direction, depicted as arrow M in FIG. 1 and defined as being substantially perpendicular to the direction of insertion of test probe 32, between second bend 52 and third bend 53. In this manner, test probe 32 is can stably flex when a force is applied in the direction of insertion shown as arrow E in FIG. 1 by the craftsperson without substantially distorting the original shape of test probe 32.

Similarly, in the preferred embodiment, test probe 33 is bent at three locations to form a first bend 61, a second bend 62 (FIG. 2) and a third bend 63 (FIG. 1). As such, referring to FIGS. 1 and 2, test probe 33 includes a first section 64 connected at one end to body 31 at connection region 36, and which extends from body 31 to first bend 61, a second section 65 that extends from first bend 61 to second bend 62, a third section 66 that extends from second bend 62 to third bend 63, and a fourth section 67 that extends from third bend 63 and includes a tip 68 and an outer surface 69. First section 64 preferably includes a straight portion that is bent at first bend 61 in a direction toward top section 12 of connector 10. As is shown in FIG. 1, first section 64 may also be bent at the location where test probe 33 is connected to body 31 at connection region 36. Second section 65 is bent at second bend 62 in a direction away from top section 12. Second bend 62 acts as a projection, which, as is described blow, abuts a portion of the connector when test probe 33 is inserted into test channel 75. Third section 66 is bent at third bend 63 in a direction toward top section 12 to create fourth section 67. Thus, test probe tip 68 is angled toward top section 12 of connector 10 in an inward direction indicated by arrow Q.

Preferably, the slope of fourth section 67 is substantially equal to the slope of inner surface 27c. Further, shoulder 19 is preferably sized and shaped to accept the outer counter of second bend 62 of test probe 33 when test probe 33 is inserted into test channel 75. In this way, as is described below, when test probe 33 is fully inserted into test channel 75, fourth section 67 substantially mates with inner surface 27c of side wall 27 and second bend 62 abuts shoulder 19 to retain test probe 33 within test channel 75. Preferably, in this position, tip 68 makes electrical contact with terminal strip portion 45a.

Preferably, first bend 61 is positioned in a lateral direction, depicted in FIG. 1 as arrow M and defined as being substantially perpendicular to the direction of insertion of test probe 33, between second bend 62 and third bend 63. In this manner, test probe 33 is can stably flex when a force is applied in the direction of insertion by the craftsperson shown as arrow E in FIG. 1 without substantially distorting the original shape of test probe 33.

Referring to FIG. 1, testing system 50 of the current invention is shown in a first position, wherein test probes 32, 33 of bridge clip 30 are depicted just prior to being inserted into test channels 70, 75, respectively. To position test probe tips 58, 68 so that they contact terminal strips 40, 45, respectively, the craftsperson presses test probes 32, 33 in the direction indicated by arrow E until tips 58, 68 contact respective sloping regions 13, 18 of top section 12.

Referring to FIG. 2, as the craftsperson continues to press bridge clip 30 in the direction indicated by arrow E, tips 58, 68 are guided by sloping regions 13, 18 into test channels 70, 75 of connector 10 until third bends 53, 63 contact the inside surfaces of upper portions 26a, 27a of side walls 26, 27.

Preferably, as is shown in FIG. 2, the width W of test probe 32 measured between bend 53 and the inner edge of tip 58 is sized to permit fourth section 57 to enter test channel 70 without causing test lead 32 to flex. In such a case, third bend 53 slides down the inner surface of upper portion 26a until second bend 52 contacts sloping region 13 as is shown in FIG. 2. If width W is larger than the narrowest distance between top section 12 and side wall 26, then test lead 32 can flex to effectively narrow width W and permit fourth section 57 to slide down the inner surface of upper portion 26a and into test channel 70.

Test lead 33 operates in a similar fashion. Preferably, the width X of test probe 33 measured between bend 63 and the inner edge of tip 68 is sized to permit fourth section 67 to enter test channel 75 without causing test lead 33 to flex. In such a case, third bend 63 slides down the inner surface of upper portion 27a until second bend 62 contacts sloping region 18 as is shown in FIG. 2. If width X is larger than the narrowest distance between top section 12 and side wall 27, then test lead 33 can flex to effectively narrow width X and permit fourth section 67 to slide down the inner surface of upper portion 27a and into test channel 75.

At this point, as is shown in FIG. 3, the craftsperson continues to apply pressure to bridge clip 30 in the direction indicated by arrow E, and second bends 52, 62 of test probes 32 and 33 slide down respective sloping regions 13, 18 and third bends 53, 63 slide down the inner surfaces of side walls 26, 27 until outside surfaces 59, 69 of fourth sections 57, 67 of test probes 32, 33 contact inner surfaces 26c, 27c of lower portions 26b, 27b of side walls 26, 27. Fourth sections 57, 67 are preferably dimensioned such that tips 58, 68 make contact with contact surfaces 40a, 45a of terminal strips 40, 45 when fourth sections 57, 67 contact inner surfaces 26c, 27c.

Referring to FIG. 3, at this position, second bends 52, 62 contact the lower edges of sloping regions 13, 18 of top section 12 of connector 10. Preferably, the length of third sections 56, 66 measured between second bends 52, 62 and third bends 53, 63 is slightly larger than the distance from inner surfaces 26c, 27c of side walls 26, 27 to shoulder surfaces 14a, 19a of top section 12. As such, the craftsperson preferably continues pressing bridge clip 30 in the direction indicated by arrow E so that first sections 54, 64 flex in respective directions indicated by arrows F and G to permit second bends 52, 62 to slide by the lower edges of sloping regions 13, 18 until second bends 52, 62 are seated within shoulders 14, 19 as is shown in FIG. 4. As discussed above, first shoulder 14 and second shoulder 19 are sized and shaped, respectively, to matingly engage with and accept second bend 52 of test probe 32 and second bend 62 of test probe 33 when test probes 32 and 33 are fully inserted into test channels 70, 75.

In this manner, at the point where second bends 52, 62 pass by the lower edges of sloping regions 13, 18, the craftsperson feels or discerns a perceptible, audible or tactile signal or "click" that indicates that test leads 32, 33 are properly snapped into and positioned within test channels 70, 75 to a predetermined, desired extent, dependent on the precise dimension of the probe and connector as a matter of design choice. A proper electrical connection is thus achieved. Once the craftsperson discerns the signal, the craftsperson stops pressing test leads 32, 33 into test channels 70, 75 thereby protecting the interior connector components of connector 10 from damage due to overinsertion.

At the position depicted in FIG. 4, test probes 32, 33 are securely seated within test channels 70, 75 between side walls 26, 27 of connector 10 and shoulders 14, 19 of top section 12, and tips 58, 68 of test probes 32, 33 make physical and electrical contact with contact edges 40a, 45a of terminal strips 40, 45. Thus, in addition to preventing test probes 32, 33 from being overinserted into test channels 70, 75, inner surfaces 26c, 27c together with shoulders 14, 19 provide surfaces that bias test probe tips 58, 68 against terminal strips 40, 45. Because the length of third sections 56, 66 is slightly larger than the distance from inner surfaces 26c, 27c of side walls 26, 27 to shoulder surfaces 14a, 19a of top section 12, test leads 32, 33 are compressed between shoulders 14, 19 and inner surfaces 26c, 27c, thereby positively biasing tips 58, 68 against contact surfaces 40a, 45a. As such, the craftsperson need not hold test probes 32, 33 to ensure proper contact with terminal strips 40, 45 when testing the electrical connection.

Figure 5:
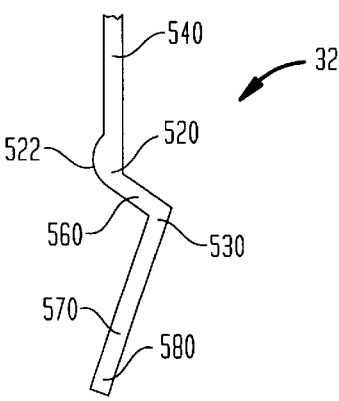
FIG. 5 is a front detail view of a test probe configured in accordance with an alternate embodiment of the invention.

In a second embodiment, as seen in FIG. 5, test probe 320 includes a tip 580 and is bent at least at two locations to form two bends. The difference between this embodiment and the embodiment described above is that the test probe has two bends 520, 530 and a projection 522 formed on the outer surface of the test probe at a position proximate to the first bend instead of having three bends. In essence, the projection replaces the need for one bend. Because the test probe of this embodiment only has two bends, the test probe is divided into three separate sections, and includes a first section 540, which is attached to the bridge clip at the body at a proximal end and is bent at a first bend 520 to form a second section 560 extending from the first bend in a direction away from top section 12 of connector 10. The second section 560 is bent at a second bend 530 to form a third section 570 that includes tip 580 and extends from the second bend in a direction toward top section 12 of connector 10. As is described below, just as in the case of the above-described first embodiment, when the test probe is in its fully inserted position within test channel 70, the second section of the test probe is compressed within test channel 70 and the test probe is secured within test channel 70 by the abutment of the projection against the top portion and by the abutment of the second bend against the inner surface of the side wall.

The second embodiment operates in a manner similar to the first described embodiment, only one channel of the connector being described for simplicity. To test an electrical connection of the connector, the craftsperson inserts the test probe 320 until tip 580 contacts sloping region 13 of the top section. Sloping region 13 guides tip 580 into test channel 70 of connector 10 until the outside surface of the third section 570 or the second bend 520 of test probe 320 contacts the inner surface of the guiding portion 26c of side wall 26 of connector 10. At this position, the projection 522 of test probe 320 contacts sloping region 13, 18 of top section 12 and is positioned at the lower edge of sloping region 13, 18, just above shoulder 14. Further pressure by the craftsperson causes the first section of the probe to flex to permit the projection 522 to slide by the lower edge of sloping region 13, until the projection 522 contacts or seats within shoulder 14. At this position, test probe 320 is firmly seated within test channel 70 between the inner surface of side wall 26 and the shoulder of top section 12 and tip 580, of test probe 320 contacts the outer edge of terminal strip 40.

As such, the current testing configuration provides a more reliable electrical connection. Further, the connector of the present invention may be used in a wiring enclosure containing a plurality of connectors, such as, for example, a junction box 100 (see FIG. 3) a building entrance protector (BEP) 110 (see FIG. 4) or a network interface unit (NIU).

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. A connector comprising:
   a top surface formed with a top section, the top section including a sloping region extending downwardly from the top surface to the shoulder;
   a shoulder formed with the top surface;
   a terminal strip mounted below said top surface;
   a test channel having therewithin a portion of the terminal strip, the channel being so shaped and sized as to guidedly urge a test probe of a test device into contact with the terminal strip portion as the test probe is inserted in the channel; and
   a side wall that defines a portion of the test channel, the side wall including a guiding portion for guiding the test probe into contact with the terminal strip, wherein the shoulder and guiding portion are shaped and sized to compressingly retain a portion of a test probe therebetween within the test channel.

2. The connector of claim 1, comprising a side wall that defines a portion of the test channel, the side wall including a guiding portion for guiding the test probe into contact with the terminal strip.

3. The connector of claim 2, wherein the top surface is formed with a top section, the top section including a sloping region extending downwardly from the top surface to the shoulder.

4. The connector of claim 3, wherein the shoulder and guiding portion are shaped and sized to compressingly retain a portion of a test probe therebetween within the test channel.

5. The connector of claim 1, wherein said connector is one of an array of connectors mounted on a connector block.

6. A wiring junction box comprising a connector, said connector having:
   a top surface formed with a top section, the top section including a sloping region extending downwardly from the top surface to the shoulder;
   a shoulder formed with the top surface;
   a terminal strip mounted below said top surface;
   a test channel having therewithin a portion of the terminal strip, the channel being so shaped and sized as to guidedly urge a test probe of a test device into contact with the terminal strip portion as the test probe is inserted in the channel, the channel including a retention feature for retaining the test probe therein; and
   a side wall that defines a portion of the test channel, the side wall including a guiding portion for guiding the test probe into contact with the terminal strip, wherein the shoulder and guiding portion are shaped and sized to compressingly retain a portion of a test probe therebetween within the test channel.

7. A building entrance protector comprising a connector having:
   a top surface formed with a top section, the top section including a sloping region extending downwardly from the top surface to the shoulder;
   a shoulder formed with the top surface;
   a terminal strip mounted below said top surface;
   a test channel having therewithin a portion of the terminal strip, the channel being so shaped and sized as to guidedly urge a test probe of a test device into contact with the terminal strip portion as the test probe is inserted in the channel, the channel including a retention feature for retaining the test probe therein; and a side wall that defines a portion of the test channel, the side wall including a guiding portion for guiding the test probe into contact with the terminal strip, wherein the shoulder and guiding portion are shaped and sized to compressingly retain a portion of a test probe therebetween within the test channel.

8. A connector testing system, comprising:

a connector having a test channel and a top section having a shoulder;

an electrically conductive terminal strip disposed within the connector, a portion of the terminal strip disposed within the test channel; and a testing device having a body and a test probe connected thereto, the test probe including a projection and a probe section angled toward the portion of the terminal strip when the test probe is inserted into the test channel, the shoulder being so sized and shaped as to matingly engage with the projection when the test probe is inserted into the test channel to a predetermined extent, so as to effect retention of the test probe in contact with the terminal strip portion within the test channel.

9. The connector testing system of claim 8, wherein the projection has a contour and the shoulder is shaped to accept the projection contour.

10. The connector testing system of claim 8, wherein the projection is formed by a bend in the test probe.

11. The connector testing system of claim 8, wherein the probe section includes a tip, the tip making electrical contact with the terminal strip when the projection abuts the shoulder.

12. The connector testing system of claim 8, wherein the connector includes a housing having a side wall, the side wall including an inner surface shaped to contact an outer surface of the probe section when the test probe is inserted into the test channel.

13. The connector testing system of claim 12, wherein the inner surface of the side wall prevents the test probe from being overinserted into the test channel.

14. The connector testing system of claim 10, wherein the probe section has a first slope and the connector includes a housing having a side wall that has a portion having a second slope, the first and second slopes being substantially equal.

15. The connector testing system of claim 12, wherein the probe section is dimensioned to be slightly longer than the distance from the shoulder to the inner surface of the side wall, such that when the projection contacts the shoulder, the probe section is compressed between the shoulder and the inner surface of the side wall to secure the test probe to the connector.

16. The connector testing system of claim 15, wherein the test probe generates a perceptible signal as the projection matingly engages with the shoulder.

17. The connector testing system of claim 8, wherein the top section includes an upper surface and a sloping region extending downwardly from the upper surface for guiding the probe section to the test channel.

18. A connector testing system, comprising:

a connector having a first test channel, a second test channel and a top section having a first shoulder and a second shoulder spaced apart from the first shoulder;

a first terminal strip disposed within the connector, the first terminal strip having a portion disposed within the first test channel;

a second terminal strip disposed within the connector and spaced apart from the first terminal strip, the second terminal strip having a portion disposed within the second test channel; and a testing device having a body, a first test probe connected to the body, and a second test probe connected to the body and spaced apart from the first test probe, the first test probe including a first projection and a first probe section angled toward the portion of the first terminal strip when the first test probe is inserted into the first test channel, the second test probe including a second projection and a second probe section angled toward the portion of the second terminal strip when the second test probe is inserted into the second test channel, the first shoulder being so sized and shaped as to matingly engage with the first projection when the first test probe is inserted into the first test channel to a predetermined extent so as to effect retention of the first test probe in contact with the first terminal strip portion within the first test channel, and the second shoulder being so sized and shaped to matingly engage with the second projection when the second test probe is inserted into the second test channel to a predetermined extent, so as to effect retention of the second test probe in contact with the second terminal strip portion within the second test channel.

19. A method of testing an electrical connection, comprising the steps of:

providing a connector having a test channel, a top section that includes a shoulder, and a terminal strip, a portion of the terminal strip being disposed in the test channel;

providing a testing device having a test probe that includes a projection and a probe section; and inserting the probe section into the test channel until the projection contacts the shoulder, whereat the probe section contacts the terminal strip to make electrical contact.

20. The method of testing an electrical connection of claim 19, comprising the step of further inserting the probe section into the test channel until the projection matingly engages with the shoulder so as to effect retention of the probe section in contact with the terminal strip.

21. The method of testing an electrical connection of claim 19, wherein the connector includes a side wall having an upper surface and a guide portion extending downwardly from the upper surface, and comprising the step of inserting the probe section into the test channel until the probe section contacts the guide portion to thereby guide the probe section to the terminal strip.

22. The method of testing an electrical connection of claim 19, wherein the connector includes a top section having an upper surface and a sloping region extending downwardly from the upper surface, and comprising the step of moving the probe section toward the connector until the probe section contacts the sloping region to thereby guide the probe section to the test channel.

23. A method of testing an electrical connection, comprising the steps of:

providing a connector having a test channel, a top section that includes a shoulder, and a terminal strip, a portion of the terminal strip being disposed in the test channel;

providing a testing device having a test probe that includes a projection and a probe section; and inserting the probe section into the test channel until the projection contacts the shoulder, whereat the probe section contacts the terminal strip to make electrical contact and the projection contacts the shoulder to retain the test probe in the test channel.

24. The method of testing an electrical connection of claim 23, wherein the connector includes a top section having a shoulder, and the testing device includes a second probe section located between the first bend and the projection, and comprising the step of inserting the test probe into the test channel to compress the second probe section until the first bend matingly engages with the shoulder, whereupon the test probe is secured to the connector and the first probe section is retained in contact with the terminal strip.

25. A bridge clip, comprising:

a body; and a first test probe connected to the body, the first test probe including a first outer surface, a first projection formed on the first outer surface, and a first probe section extending in an inward direction.

26. The bridge clip of claim 25, comprising a second test probe connected to the body and spaced apart from the first test probe, the second test probe including a second outer surface, a second projection formed on the second outer surface, and a second probe section extending toward the first probe section.

27. A bridge clip, comprising:

a body; and a test probe connected to the body and extending in a substantially vertical direction, the test probe including a first bend, a second bend and a third bend, a probe section extending from the third bend, the first bend being positioned intermediate the second and third bends in a direction substantially perpendicular to the vertical direction.

* * * * *